United States Patent [19]

Birang et al.

[11] Patent Number: 5,459,632
[45] Date of Patent: Oct. 17, 1995

[54] RELEASING A WORKPIECE FROM AN ELECTROSTATIC CHUCK

[75] Inventors: Manoocher Birang, Los Gatos; Grigory Pyatigorsky, Santa Clara, both of Calif.

[73] Assignee: Applied Materials, Inc., Santa Clara, Calif.

[21] Appl. No.: 207,331

[22] Filed: Mar. 7, 1994

[51] Int. Cl.[6] .................................................. H02N 13/00
[52] U.S. Cl. ............................ 361/234; 307/130; 361/235
[58] Field of Search ........................ 361/143, 144, 361/145, 207, 437, 225, 235, 234; 320/1; 250/491.1, 492.2, 396 R, 398; 307/130, 127; 269/8, 903; 279/155, 901, 126, 128

[56] References Cited

U.S. PATENT DOCUMENTS 4,667,110  5/1987  Kariya .................................. 250/492.2
5,117,121  5/1992  Watanabe et al. ....................... 307/130
5,221,450  6/1993  Hattori et al. ....................... 204/192.32

FOREIGN PATENT DOCUMENTS 6418236  1/1994  Japan .

Primary Examiner—Steven L. Stephan
Assistant Examiner—Aditya Krishnan
Attorney, Agent, or Firm—Raymond R. Moser, Jr.; John T. Peoples; Peter J. Sgarbossa

[57] ABSTRACT

Method and apparatus for releasing a workpiece, such as a semiconductor wafer, from an electrostatic chuck. A "dechucking" voltage is applied to the chuck electrode having the same polarity as was used to retain the workpiece, but having a different magnitude selected to minimize the electrostatic attractive force between the workpiece and the chuck. There is an optimum value for the dechucking voltage which minimizes this force. The optimum value can be determined empirically, or it can be determined by a method based on the value of the current pulse produced when the workpiece is first mounted on the chuck.

11 Claims, 3 Drawing Sheets

RELEASING A WORKPIECE FROM AN ELECTROSTATIC CHUCK

BACKGROUND OF THE INVENTION

1. Field of the Invention

The invention relates generally to electrostatic chucks for holding a workpiece and, more specifically, to methods and apparatus for releasing a workpiece (such as a semiconductor wafer) from an electrostatic chuck.

2. Description of the Prior Art

Electrostatic chucks are used for holding a workpiece in various applications ranging from holding a sheet of paper in a computer graphics plotter to holding a semiconductor wafer within a semiconductor fabrication process chamber. Although electrostatic chucks vary in design, they all are based on the principle of applying a voltage to one or more electrodes in the chuck so as to induce opposite polarity charges in the workpiece and electrode(s), respectively. The electrostatic attractive force between the opposite charges presses the workpiece against the chuck, thereby retaining the workpiece.

A problem with electrostatic chucks is the difficulty of removing the electric charge from the workpiece and the chuck when it is desired to release the workpiece from the chuck. One conventional solution is to connect both the electrode and the workpiece to ground to drain the charge. Another conventional solution which purportedly removes the charge more quickly is to reverse the polarity of the DC voltage applied to the electrodes. This is described in the context of a chuck having two electrodes (a bipolar chuck) in U.S. Pat. No. 5,117,121 to Watanabe et al.

A shortcoming we have observed with these conventional approaches to removing the electric charge is that they fail to completely remove the charge, so that some electrostatic attractive force remains between the workpiece and the chuck. This residual electrostatic force necessitates the use of a large mechanical force to separate the workpiece from the chuck. When the workpiece is a semiconductor wafer, the force required for removal sometimes cracks or otherwise damages the wafer. Even when the wafer is not damaged, the difficulty of mechanically overcoming the residual electrostatic force sometimes causes the wafer to pop off the chuck unpredictably into a position from which it is difficult to retrieve by a conventional wafer transport robot.

SUMMARY OF THE INVENTION

According to our invention, a workpiece can be released from an electrostatic chuck by applying to the chuck electrode a "dechucking" voltage having the same polarity as was used to retain the workpiece, but having a different magnitude selected so as to minimize the electrostatic attractive force between the workpiece and the chuck. We have found that the dechucking voltage can be set to an optimum value which allows the workpiece to be removed from the chuck with much less force than required by conventional dechucking methods.

In view of known teachings that the dechucking voltage should be either zero or of polarity opposite that of the chucking (i.e., retaining) voltage, it is surprising that our invention can more successfully minimize the retaining force on the workpiece using a dechucking voltage of the same polarity as the chucking voltage.

Additional aspects of our invention are methods and apparatus for determining the optimum value for the dechucking voltage.

DETAILED DESCRIPTION OF PREFERRED EMBODIMENTS

1. Conventional Plasma Chamber with Electrostatic Chuck

Figure 1:
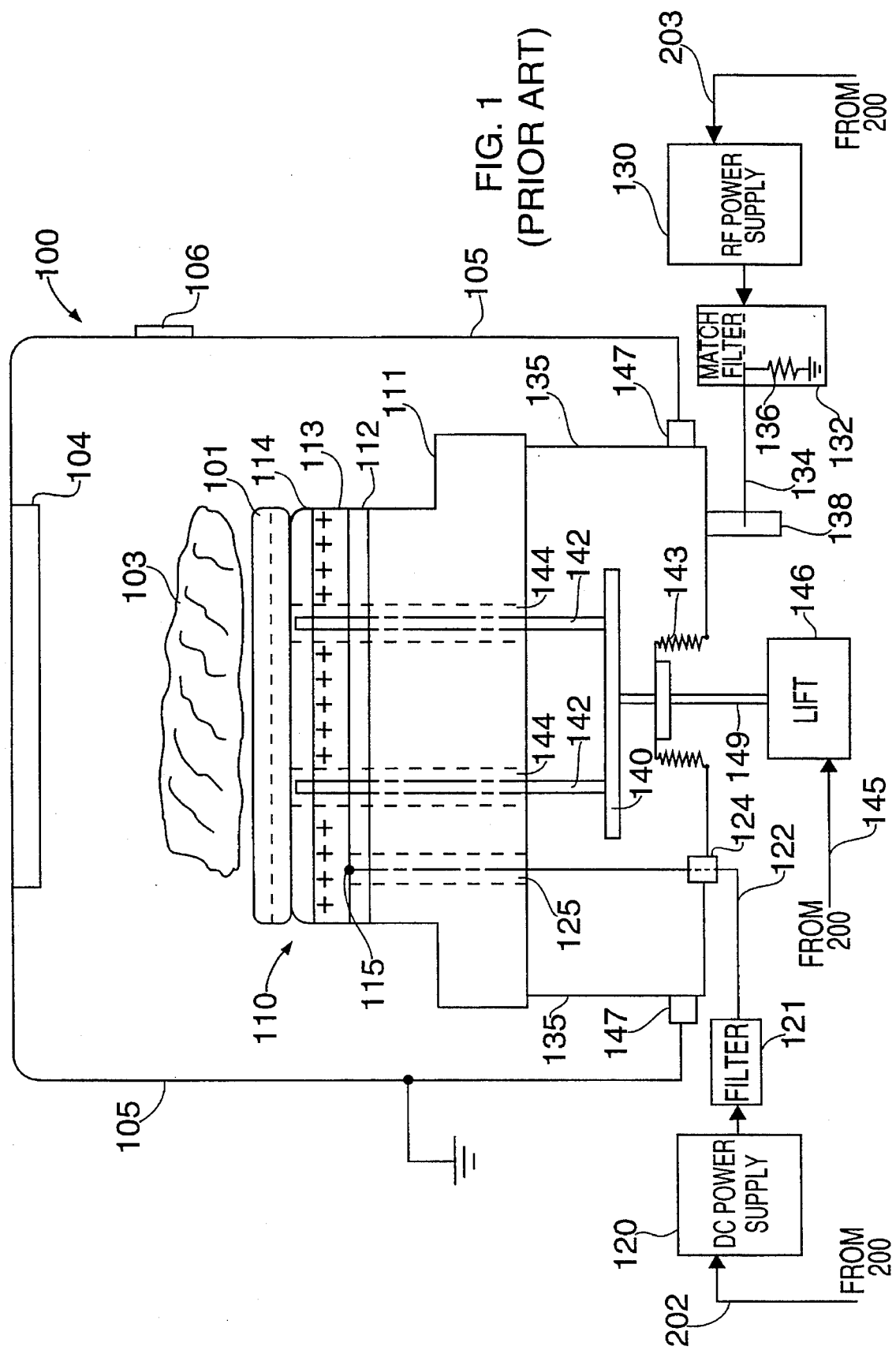
FIG. 1 is a sectional view, partially in schematic form, of a conventional semiconductor wafer fabrication process chamber which includes a conventional electrostatic chuck to which our invention can be applied.

Our novel dechucking method and apparatus is intended to be used in combination with a conventional electrostatic chuck. FIG. 1 shows such a chuck 110 as it typically would be configured within a vacuum chamber 100 used for plasma-enhanced processing (for example, etching or chemical vapor deposition) of a semiconductor wafer 101.

The conventional vacuum chamber 100 includes a vacuum-tight enclosure 105 which is made of aluminum and electrically grounded. A disc-shaped anodized aluminum anode electrode 104 is mounted just below the upper wall or lid of the enclosure 105 and is electrically connected to the grounded enclosure.

The conventional electrostatic chuck includes an anodized solid aluminum cathode pedestal 111 having a circular, planar top face; a lower dielectric layer 112 bonded to the top face of the pedestal 111; a metal chuck electrode 113 bonded to the top face of the lower dielectric; and an upper dielectric layer 114 bonded to the top face of the chuck electrode. In the preferred embodiment, both dielectric layers are 75 micron thick polyimide.

The cathode pedestal 111 is mounted on top of, and electrically connected to, a hollow anodized aluminum cathode base 135. The cathode base is mounted on the lower wall of enclosure 105 by means of an electrically insulating, annular flange 147. Electrical connection to the cathode is made by a copper rod 138 having a threaded end which is screwed into a tapped hole at the bottom of the cathode base 135. A copper clip (not shown) connects the rod 138 to RF transmission line 134, which in turn connects to impedance matching network 132, which in turn connects to RF power supply 130. The matching network 132 includes a 10 megohm resistor 136 across its output to provide a DC path from the cathode to ground.

Electrical connection to the chuck electrode 113 is made by an insulated wire 122 which is attached to the chuck electrode 113 at point 115. The wire 122 extends downward from the electrode 113 through a bore 125 in the cathode pedestal 111, and then out the bottom of the enclosure 105 through a feed-through insulator 124. The wire 122 connects to an RF-blocking low pass filter 121, and in turn to DC voltage supply 120.

During processing of a semiconductor wafer 101 in the chamber 100, the wafer rests on the upper face of the upper dielectric 114 as shown in FIG. 1. After processing is completed, a robot arm (not shown) removes the wafer from the chamber. To facilitate sliding the "blade" end of the robot arm under the wafer, several (preferably four, but at least three) lift pins 142 lift the wafer 2 to 5 cm above the chuck 110. Each lift pin 142 slides vertically in a corresponding bore 144 in the cathode pedestal 111. All the lift pins 142 are mounted on a carriage 140, which is raised and lowered by a pneumatic lift mechanism 146 under control of a programmable digital computer (not shown). In the illustrated embodiment, the lift pins 142 and carriage 140 are inside the cathode base 135 within the vacuum chamber 100, whereas the pneumatic lift mechanism 146 is outside the vacuum chamber. They are mechanically connected by a linkage 149 passing through a bellows 143 which permits movement while maintaining a vacuum seal.

In the conventional operation of the process chamber 100, a robot arm (not shown) moves a wafer 101 into the chamber through a slit valve 106. The robot places the wafer on the tips of lift pins 142, which at this time are elevated by the pneumatic lift mechanism 146 so as to protrude 2 to 5 cm above the top of the electrostatic chuck 110. The pneumatic mechanism then lowers the lift pins 142 so that the wafer 101 drops onto the top face of the chuck 110, the wafer's descent time typically is 3 to 10 seconds.

Shortly before the wafer 101 drops onto the chuck 110, the chucking voltage supply 120 applies a high DC voltage, on the order of +2000 volts, to the chuck electrode 113 relative to ground. Typically at least one (preferably all) of the lift pins 142 is metal and is electrically connected to the cathode base 135, which in turn is connected to an electrical ground through the 10 megohm resistor 136. As the lift pins lower the wafer onto the chuck, the grounded lift pin(s) maintain the wafer at or near ground potential, so that the 2000 volt chucking voltage appears between the wafer and the chuck electrode 113. This voltage causes negative and positive charges to accumulate on the facing surfaces of the wafer and chuck electrode, respectively. The amount of charge is proportional to the product of the voltage and the capacitance between the wafer and the chuck electrode.

After the wafer drops onto the upper dielectric 114 of the chuck 110, the lift pins 142 continue to descend, so that the wafer no longer is electrically grounded. However, the charge remains trapped on the wafer. The opposite polarity charges on the wafer and the chuck electrode produce an electrostatic attractive force which presses the wafer against the upper face of the chuck. The chucking voltage (2000 volts in this example) is set to a value high enough to produce an electrostatic force between the wafer and the chuck adequate to prevent wafer movement during subsequent process steps. The wafer thus retained securely on the chuck is said to be "chucked".

After the wafer is chucked, one or more semiconductor fabrication process steps are performed in the chamber 100, such as deposition or etching films on the wafer. For processes which employ a plasma, the RF power supply 130 applies RF power between the cathode pedestal 111 and the grounded anode 104, which excites a plasma in the region between the wafer 101 and the anode. The plasma provides an electrically conductive path between the wafer and ground. However, because of the difference between the mobilities of electrons and positive ions, a DC voltage drop appears across the plasma so that the wafer is biased negative relative to ground. If the chucking voltage applied to the chuck electrode 113 by the DC voltage supply 120 is positive, the total voltage between the wafer and the chuck electrode will be the sum of the wafer bias voltage and the chucking power supply voltage. Thus, the wafer bias increases the electrostatic force retaining the wafer.

After completion of the semiconductor fabrication process steps, the pneumatic lift mechanism 146 raises the lift pins 142 to raise the wafer above the chuck 110 so that the wafer can be removed from the chamber by a robot. Before the lift pins can raise the wafer, the wafer must be "dechucked"; that is, the electrostatic force retaining the wafer on the chuck 100 must be removed. Conventionally, the chucking voltage supply 120 is turned off and the chuck electrode 113 and the wafer 101 are both connected to ground so as to remove the respective charges which had accumulated on the chuck electrode and the wafer during the previous application of the chucking voltage to the chuck electrode.

The wafer conventionally is grounded when the metal lift pins 142, which are grounded, strike the bottom of the water when the wafer is being lifted. Alternatively, the wafer conventionally is grounded by leaving the RF power supply on at a reduced power level to maintain a plasma 103 which provides an electrically conductive path from the wafer to the grounded walls 105 of the chamber.

2. Novel Dechucking Method

A problem we have observed with this conventional dechucking method is that it does not succeed in removing all of the electrostatic attractive force between the wafer and the chuck 110, so that excessive force is required to remove the wafer from the chuck. This force can crack the wafer, or it can cause the wafer to pop off the chuck into a position from which it is difficult to retrieve and align properly by a wafer transfer robot.

We have discovered that the electrostatic force on the wafer can be essentially eliminated, thereby permitting easy removal of the wafer from the chuck, by applying between the chuck electrode 113 and the wafer a "dechucking" voltage having the same polarity as the chucking voltage, but having a smaller magnitude. We have found there is an optimum value for the dechucking voltage; if the applied dechucking voltage is above or below this optimum value, a significant electrostatic attractive force will remain between the wafer and the chuck.

We believe the reason for this behavior is that a charge, of polarity opposite the polarity of the chucking voltage applied to the chuck electrode 113, accumulates in the upper dielectric 114 during the period the chucking voltage is applied to the chuck electrode 113. Because charges cannot readily flow in a dielectric, the conventional method of releasing the wafer from the chuck by grounding both the wafer and the chuck electrode does not remove the charge from the upper dielectric 114.

Accordingly, our invention can be regarded as a dechucking method which compensates for the effects of charge trapped in the upper dielectric 114. Our invention is independent of how the dielectric acquired the charge. However, while the invention does not depend on the following theory, we believe the following physical mechanism is the principal reason the upper dielectric 114 accumulates negative charge when a large, positive chucking voltage is applied to the chuck electrode 113 relative to the wafer 101.

Because the wafer and the upper dielectric both have, at a microscopic level, imperfectly flat surfaces, the wafer and dielectric actually contact each other only at thousands of tiny points, leaving thousands of microscopic gaps between the wafer and dielectric. The chucking voltage between the wafer and the chuck electrode produces a strong electric field across these microscopic gaps. At chucking voltages high enough to securely retain the wafer on the chuck, we believe this electric field causes electrons to migrate from the wafer to the adjacent surface of the upper dielectric through the physical mechanism of "field emission". When the chucking voltage, and hence the electric field, is removed, the electrons accumulated in the dielectric have no discharge path, so they remain in the dielectric.

We have successfully tested our novel methods and apparatus for applying a dechucking voltage to release a semiconductor wafer. Therefore, the utility of our invention is not dependent on whether our understanding of the physical mechanism for accumulation of charge on the upper dielectric proves to be accurate.

To simplify the description in the remainder of this patent specification, we will assume the chucking voltage applied to the chuck electrode is positive. Consequently, the charge accumulated in the upper dielectric 114 is negative. (If a negative chucking voltage were used, the operation of the invention would be the same, except all charges would be of opposite polarity.)

When a positive dechucking voltage is applied to chuck electrode 113 relative to the semiconductor wafer 101, a positive charge accumulates on the upper surface of chuck electrode 113. The mount of positive charge is proportional to the dechucking voltage multiplied by the capacitance between chuck electrode 113 and the wafer 101. We believe the optimum value of the dechucking voltage which releases the wafer is the value which produces a positive charge on the upper surface of the chuck electrode approximately equal to the negative charge in the upper dielectric 114. Under this condition, any electrostatic charge on the semiconductor wafer 101 will be negligible, so there will be essentially no electrostatic attraction force between the wafer and the chuck. In other words, the wafer will be released from the chuck.

For a given wafer and a given chucking voltage, the optimum dechucking voltage can be found empirically by the following series of steps:

Step 1: Connect an adjustable voltage source between the chuck electrode and the wafer, and adjust it to supply the chucking voltage normally needed to retain the wafer on the chuck. At this point the electrostatic force should hold the wafer tightly against the chuck so that the wafer cannot readily slide across the surface of the chuck, much less be lifted from the chuck.

Step 2: Incrementally reduce the voltage. After each incremental reduction, tap the edge of the wafer to observe whether the electrostatic force has been reduced sufficiently to allow the wafer to slide across the surface of the chuck.

Step 3: When the wafer does slide, the voltage is close to the optimum dechucking voltage. If desired, the optimum voltage may be further refined by measuring the force required to mechanically lift the wafer from the chuck at different dechucking voltages close to the approximate optimum value found in step 2. The optimum dechucking voltage is the one which minimizes the mechanical force required to lift the wafer.

In steps 2 and 3, alternative means could be used to test whether the electrostatic force has been reduced sufficiently to permit safe removal of the wafer from the chuck. For example, instead of tapping the edge of the wafer, a lift mechanism (such as lift pins 142 and mechanism 146) could be adjusted to apply a predetermined, small mechanical force to the underside of the wafer so as to push the wafer away from the chuck. The wafer will remain on the chuck until the voltage between the chuck electrode and the wafer approximately equals the optimum dechucking voltage, so that the electrostatic force retaining the wafer against the chuck falls below the predetermined mechanical force.

The optimum dechucking voltage will be approximately the same for wafers having similar electrical and mechanical characteristics, especially wafers from a single processing batch. Therefore, the optimum dechucking voltage can be determined for one wafer, and then the same dechucking voltage can be used for each successive water in a batch. Specifically, when each wafer is placed on the chuck, the normal chucking voltage supply 120 should apply the normal chucking voltage (for example, +2000 volts) to the chuck electrode to retain the wafer during processing. When processing of the water is finished, the output of the DC voltage supply 120 should be reduced to the optimum dechucking voltage previously determined for the first wafer in the batch (for example, +600 volts) so as to release the wafer from the chuck. At this point the wafer can be removed from the chamber, and the cycle can be repeated for the next water in the batch.

However, we have found the optimum dechucking voltage varies enough from one wafer to the next, even within a single batch, that it is preferable to determine the optimum dechucking voltage for each individual wafer. Specifically, between the first and last wafer in a batch of 25 wafers, we have observed the optimum dechucking voltage to progressively decline from +600 volts to +400 volts. (Smaller variations in the optimum dechucking voltage from wafer to wafer also may occur due to differences in wafer flatness or smoothness, and even the presence of particles between the wafer and the chuck. These differences affect the size of the microscopic gaps between the wafer and the chuck, and hence affect the capacitance between the wafer and the chuck electrode.) Our preferred method of quickly determining the optimum dechucking voltage for each wafer is described in the following Section 3.

In summary, our novel method of releasing a semiconductor wafer from an electrostatic chuck (i.e., "dechucking" the wafer) is to apply a dechucking voltage between the chuck electrode and the wafer. The dechucking voltage has the same polarity as the previously applied chucking voltage and should approximately equal an optimum voltage value which minimizes or eliminates the electrostatic force holding the wafer on the chuck. The value of the dechucking voltage can be set to a value established empirically as described above, or, much more preferably, the value of the dechucking voltage can be set by the novel method described immediately below.

3. Determining Optimum Dechucking Voltage

The preceding empirical method of determining the dechucking voltage is impractical for production applications because we have found that the optimum dechucking voltage varies from one batch of wafers to the next. Fortunately, we also have developed a method and apparatus for automatically determining the optimum dechucking voltage for an individual wafer at the time it is loaded onto the chuck.

Our automatic method establishes the dechucking voltage by connecting the chucking voltage supply 120 between the chuck electrode 113 and the semiconductor wafer 101 while the wafer is some distance above the chuck 110, and then measuring (directly or indirectly, as will be explained below) the surge of current flow from the chucking voltage supply 120 when the wafer is lowered onto the upper dielectric 114 of the chuck 110. We believe the current surge is the charging up of the capacitance between the chuck electrode 113 and the wafer 101. The capacitance is inversely proportional to the distance between the wafer and the chuck electrode. Since the thickness of the upper dielectric is typically only 75 microns, the capacitance jumps up quickly when the wafer touches the upper dielectric.

If there is no charge in the upper dielectric 114, the current surge will be directly proportional to the chucking voltage. However, if there is a negative charge in the upper dielectric, the current surge will be reduced by an amount proportional to the amount of negative charge.

Stated differently, the "effective" chucking voltage can be considered to be the difference between the actual chucking voltage and a hypothetical "offset" voltage due to the negative charge in the upper dielectric. The current surge when the wafer is lowered onto the chuck is proportional to the "effective" chucking voltage. The hypothetical "offset" voltage equals the voltage which, if applied to the chuck electrode, would produce a positive charge on the upper surface of the chuck electrode which balances or offsets the negative charge in the dielectric. In other words, the hypothetical "offset" voltage equals the optimum dechucking voltage which would eliminate the electrostatic force on the warn. Based on these findings, we have developed the following method for determining the optimum dechucking voltage.

Step 1: While the wafer 101 is held some distance above the chuck 110 (1 millimeter probably would suffice, but 1 to 5 cm is convenient), set the chucking voltage supply 120 to apply a "test" chucking voltage between the chuck electrode 113 and the wafer. The "test" voltage should remain on during the following steps.

Step 2: Measure the surge of current flow between the chucking power supply 120 and the chuck electrode 113 when the wafer 101 is lowered onto the upper dielectric 114.

Step 3: Calculate the "effective" chucking voltage by multiplying the measured value of the current surge by a proportionality constant "R". (The value of "R" should be predetermined by the calibration procedure described below.)

Step 4: Set the dechucking voltage to the value of the "test" chucking voltage minus the value of the "effective" chucking voltage found in Step 2.

The "test" voltage applied to the chuck electrode relative to the wafer preferably is about the same as the chuckling voltage intended to be used during subsequent processing of the wafer 101 within the process chamber 100, which is +2000 volts in the preferred embodiment. A metal lift pin 142 touching (and supporting) the bottom of the wafer is electrically grounded, thereby providing an electrical connection between the wafer and the grounded output terminal of the voltage source 120.

The following section 4 of this patent specification describes how to calibrate the value of the constant R. We have found that the value of R is independent of differences in wafers being processed, and is dependent only on the characteristics of the hardware associated with the process chamber, such as the speed of the mechanism for lowering the wafer onto the chuck and the capacitances among components of the electrostatic chuck and the chamber.

Consequently, an important advantage of the present invention is that the value of R only needs to be calibrated once for a given apparatus. ("Apparatus" includes the hardware associated with the process chamber 100, such as the electrostatic chuck and the electro-mechanical control systems.) We have found we can calibrate the value of R before shipping a process chamber to a customer by performing the method described in the following section 4 using a single sample wafer. We then can permanently program this calibration value into the control system for the process chamber. For each wafer that is subsequently processed by the chamber, the control system automatically provides the optimum dechucking voltage for each wafer in accordance with the simple four step method described in the third preceding paragraph.

In some applications it may be impractical to implement Step 1 of the preceding 4-step method because a voltage cannot be applied to the wafer while it is held above the chuck. For example, some wafers have a dielectric coating on their backs which precludes electrical contact between the semiconductor substrate and the metal lift pins. Also, some process chambers do not use metal lift pins.

In such applications in which the wafer remains insulated from electrical ground or other voltages while it is placed onto the chuck, the preceding 4-step method for determining the optimum dechucking voltage can be modified. Specifically Steps 1 and 2 can be replaced by the following Steps 1a, 1b and 2a:

Step 1a: Set the chucking voltage supply 120 to apply a "test" chucking voltage between the chuck electrode 113 and the electrical ground for the chamber 100. This step allows the capacitances between the chuck electrode and other chamber components, such as the cathode pedestal 111, to charge up, so that the pulse measured in Step 2 a will reflect only the charging of the capacitance between the wafer an the chuck electrode.

Step 1b: Place the wafer 101 on the upper dielectric 114. (Step 1b can be performed at any time before Step 2a, and even can be performed before Step 1a.)

Step 2a: Bring an electrically grounded probe into contact with a point on the wafer which is in electrical contact with the semiconductor substrate. Measure the surge of current flow between the chucking power supply 120 and the chuck electrode 113 when the probe contacts the wafer.

In either Step 2 or Step 2a, the current flow into the wafer should equal the current flow into the chuck electrode, so the former could be measured rather than the latter.

4. Empirically Calibrating the Constant "R"

Our method of setting the dechucking voltage, as described in the preceding section 3, relies on a calibration constant R which relates the value of the current pulse produced when the wafer is dropped on the chuck to the "effective" chucking voltage. The value of R can be empirically determined by measuring the current pulse $I_1$ produced when a first chucking voltage $V_1$ is applied while the wafer is lowered onto the chuck, and then measuring the current pulse 12 produced when a different chucking voltage $V_2$ is applied while the same wafer is lowered onto the chuck. The constant R then is determined from the formula: $R=(V_2-V_1)/(I_2-I_1)$. This formula can be derived by combining the following two equations: $I_1=(V_1-V_{offset})/R$ and $I_2=(V_2-V_{offset})/R$ However, this method of determining R works only if the negative charge on the upper dielectric 114—i.e., the hypothetical "offset" voltage $V_{offset}$—does not change between the two measurements. We have found that if the charge on the upper dielectric is removed by wiping it with an electrically grounded, conductive cloth, no electric charge will accumulate on the upper dielectric if the voltage applied to the chuck electrode remains low enough (substantially lower than the values normally used to retain a wafer). For example, when testing the present invention on a conventional electrostatic chuck, we found that after discharging the upper dielectric with a grounded, conductive cloth, applying a voltage no greater than 1000 volts between the chuck electrode 113 and the wafer 101 would not create any charge in the upper dielectric, even though applying the normal chucking voltage of 2000 volts would create a negative charge in the dielectric.

Therefore, we were able to empirically determine R by the following steps.

Step 1: Discharge the upper dielectric with a grounded conductive cloth.

Step 2 (optional but preferred step): Seal chamber and reduce pressure to typical operating vacuum (for example, 1 mTorr).

Step 3: Adjust a voltage supply to a first, relatively low voltage $V_1$ (such as 500 volts) and connect it between the water and the chuck electrode while the wafer is separated from the chuck.

Step 4: Leaving the voltage supply connected between the wafer and the chuck electrode, measure the current pulse ($I_1$) between the voltage supply and the chuck electrode when the wafer is lowered onto the chuck.

Step 5: Separate the wafer from the chuck, and adjust the voltage supply to a second, relatively low voltage $V_2$ (such as 1000 volts).

Step 6: Repeat Step 4 to measure the current pulse $I_2$ corresponding to voltage $V_2$.

Step 7: Calculate $R=(V_2-V_1)/(I_2-I_1)$.

Clearly, this procedure for determining R can be generalized by performing the measurements at any two voltage values $V_1$ and $V_2$ which are low enough to avoid charging of the upper dielectric.

Instead of using two voltage values which are too low to impose a charge on the upper dielectric, an alternative approach would be to perform steps 2 and 3 at the normal chucking voltage (for example, $V_1$=2000 volts), and then perform steps 4 and 5 at a slightly reduced voltage (for example, $V_2$=1900 volts), where the difference between the two voltages (100 volts in the example) is chosen to be too small to alter the charge on the upper dielectric between the two measurements.

Although the invention does not depend on the following theory, as explained earlier we believe the upper dielectric 114 accumulates negative charge because the chucking voltage produces a strong electric field across the thousands of microscopic gaps between the wafer and dielectric. At chucking voltages high enough to securely retain the wafer on the chuck, we believe this electric field causes electrons to migrate from the wafer to the adjacent surface of the upper dielectric through the physical mechanism of "field emission".

We believe that if the chucking voltage is maintained at a low enough magnitude, no accumulation of charge will occur on the dielectric because the electric field in the microscopic gaps between the wafer and the dielectric will be too low to cause field emission of electrons. This last principle explains why we use low voltages for $V_1$ and $V_2$ in the preceding 7-step method for determining the proportionality constant R.

We wish to reiterate that we have successfully tested our novel methods and apparatus for applying a dechucking voltage to release a semiconductor wafer. Therefore, the utility of our invention is not dependent on whether our understanding of the physical mechanism for accumulation of charge on the upper dielectric proves to be accurate.

5. Pulse Measurement Techniques and Corresponding Proportionality Constants

Measuring pulses or surges of current flow between the chucking power supply and the chuck electrode is required in both: (1) the 4-step method defined in Section 3 for determining the optimum dechucking voltage, and (2) the 7-step method defined in Section 4 for calibrating the proportionality constant "R". However, the preceding discussion did not specify what parameter of a current pulse should be measured.

The purpose of these measurements is to determine the amount of charge transferred to or from the chuck electrode. This can be measured directly using a conventional integrator circuit whose output represents the time integral over the duration of the current pulse of the current flow into (or out of) the chuck electrode. Of course, the current flow is most readily sensed by connecting a resistor (such as resistor 210 in FIG. 2) in series between the chuck electrode 113 and the chucking voltage supply 120, so that the voltage drop across the resistor is proportional to the current flow into the chuck electrode. This voltage can be connected to the input of the integrator circuit.

Instead of measuring the time integral of the current pulse, we have found that an expedient alternative is to measure the amplitude peak of the current pulse, or, more specifically, to measure the peak value of the voltage pulse across a series resistor. For a given set of time constants in the measuring circuit and in the process chamber hardware, we have found the measured peak value is proportional to the amount of charge transfer. The circuitry actually used in our currently preferred embodiment to measure the peak value of the appropriate voltage pulses is described in the following section of this patent specification.

Whichever of these alternative techniques for measuring the current pulse is chosen, the chosen technique should be used: (1) to measure the "value of the current surge" in the 4-step method defined in Section 3 for determining the optimum dechucking voltage, and (2) to measure $I_1$ and $I_2$ in the 7-step method defined in Section 4 for calibrating the constant "R". Because different pulse measurement techniques will produce measurements which differ by different proportionality factors, the value of "R" obtained by the Section 4 calibration method also will differ by corresponding proportionality factors depending on which pulse measurement technique is chosen. However, this is no problem so long as the same pulse measurement technique is used both to calibrate "R" and to determine the optimum dechucking voltage using "R". (Furthermore, it even should be possible to use two different pulse measurement techniques for the calibration method and the dechucking method, respectively, if the value of "R" is multiplied by a scale factor representing the ratio of measurements obtained by the two techniques.)

6. Novel Apparatus for Implementing Our Dechucking Method

Figure 2:
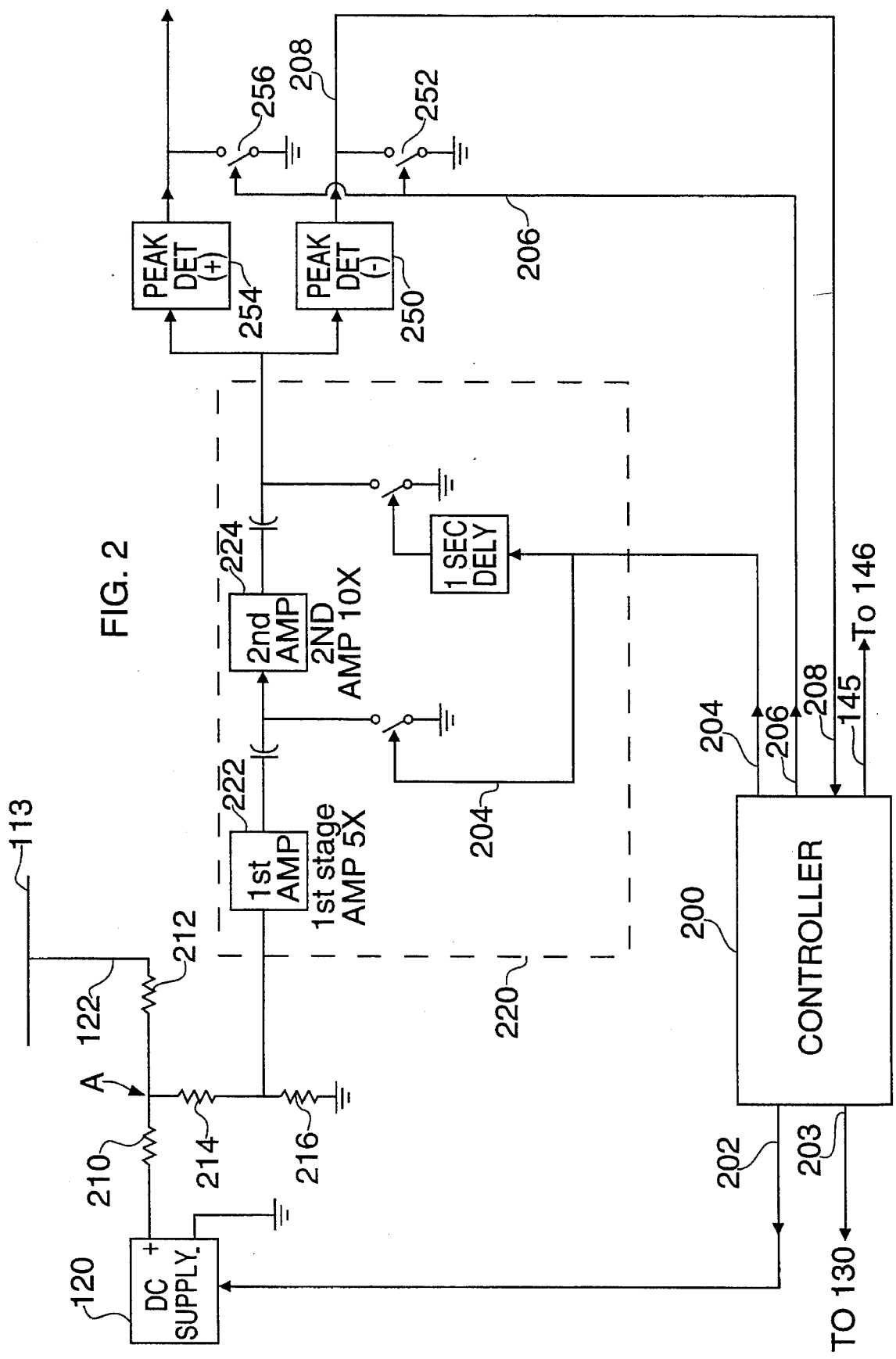
FIG. 2 is schematic diagram of an electrical control system used in the preferred embodiment of the invention.

FIG. 2 shows our presently preferred apparatus for performing our dechucking method in conjunction with the conventional process chamber and electrostatic chuck shown in FIG. 1.

A conventional digital microcontroller 200 is programmed to implement the measurements required by our method for determining the dechucking voltage, store the measured values in its memory, calculate the desired chucking or dechucking voltage, and control the voltage applied by chucking voltage supply 120 to the chuck electrode 113.

The chucking voltage supply 120 has an output voltage which varies in response to a control signal received on electrical signal line 202 from controller 200. The negative output terminal of the voltage supply is grounded, and the positive output terminal is connected to the chuck electrode 113 through two 1-megohm resistors 210 and 212 connected in series. An AC-coupled amplifier 220 has its ungrounded input connected to the junction "A" of the two 1-megohm resistors through a 10-megohm resistor 214. The amplifier input is also connected to ground through a 10-kilohm resistor 216 so that resistors 214 and 216 form a 1000:1 voltage divider, and consequently the voltage at the amplifier input is 1/1000 of the voltage $V_A$ at the junction A.

The AC-coupled amplifier 220 has a voltage gain of 50, so that it provides at its output a voltage equal to the AC component of $V_A$ divided by 20. (The preferred embodiment of amplifier 220 shown in FIG. 2 contains two cascaded amplifiers 222 and 224 having voltage gains of five and ten, respectively.) The output of amplifier 220 connects to the input of a conventional peak detector 250 which stores at its output the peak negative voltage received at its input since the last time the peak detector was enabled. The peak detector can be disabled by grounding (i.e., "resetting") its output using a transistor switch 252. The peak detector is enabled when switch 252 is open. (FIG. 2 also shows a positive peak detector 254 and corresponding reset switch 256, but these are not used in the preferred method of operation about to be described.)

The amplifier 220 includes circuitry for disabling its output so that it provides zero voltage to the peak detector 250 based on the value of an enable control signal received on signal line 204 from the microcontroller 200. The microcontroller also controls the transistor switch 252 by sending a control signal to the switch over signal line 206. Lastly, the microcontroller receives the output voltage from the peak detector over signal line 208.

Figure 3:
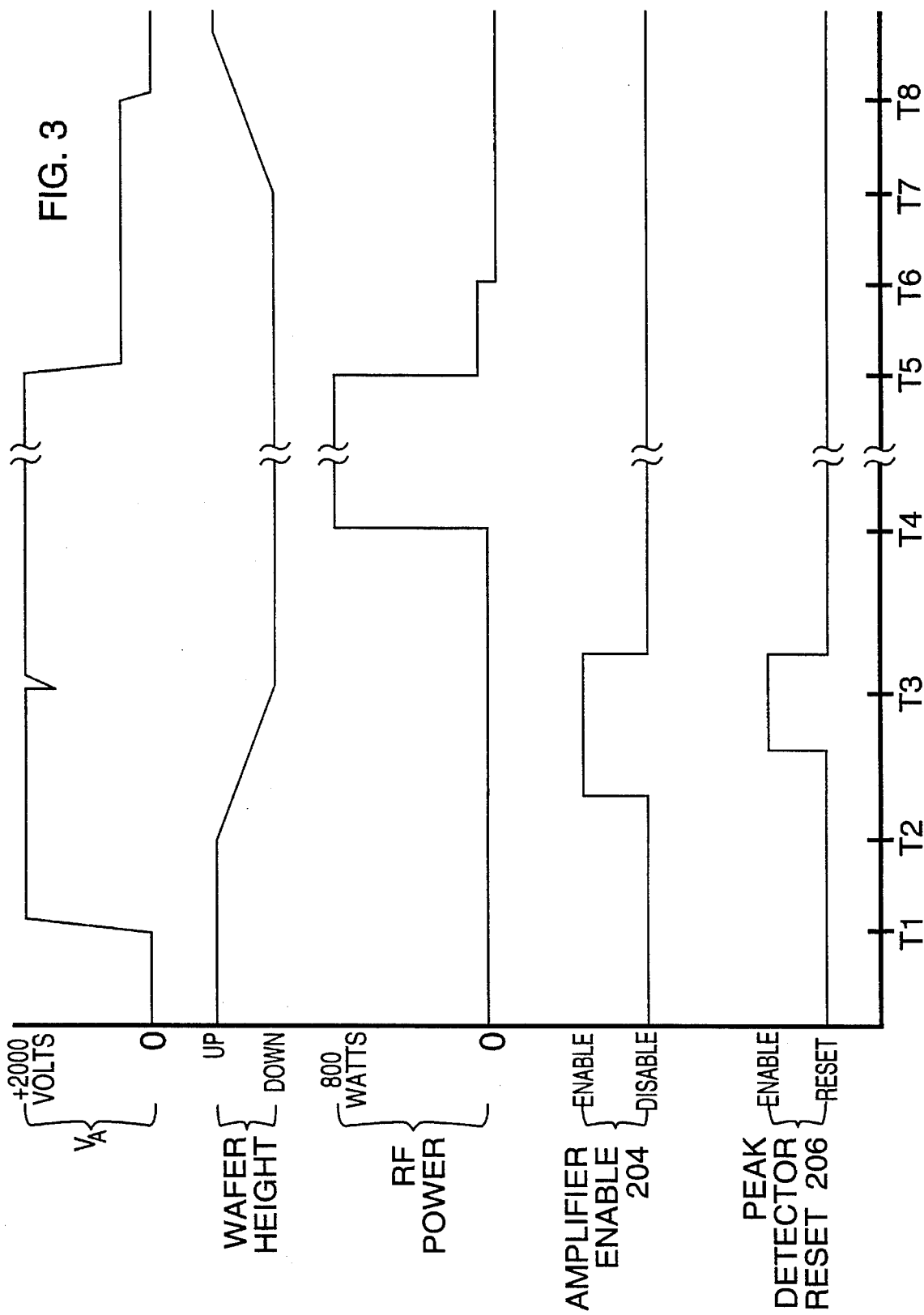
FIG. 3 is a timing diagram illustrating the operation of the preferred embodiment of the invention.

The operation of this apparatus is best understood by reference to the timing diagram of FIG. 3. All activities described below are directed by the programming of the microcontroller 200 which controls the various electrical and electro-mechanical components in a conventional manner. The timing diagram begins with the apparatus in the following state: The semiconductor wafer 101 is supported by lift pins 142 about 2.5 cm above the chuck 110. The chucking voltage supply 120 and the RF power supply 130 are set to zero output power. The amplifier 220 and the peak detector 250 are disabled. A vacuum pump (not shown) maintains vacuum inside the process chamber 100. (In the plasma etch chamber we used to test the preferred embodiment, the vacuum pump maintained a chamber pressure of about 1 mTorr.)

At time $T_1$ the microcontroller 200 sends a control signal over wire 202 which directs the chucking voltage supply 120 to output the "test" chucking voltage, which in the preferred embodiment is +2000 volts. As the capacitance between the chuck electrode 113 and the cathode 111 quickly charges up, the voltage $V_A$ at junction A quickly jumps to +2000 volts. The controller 200 continues to disable the amplifier 220 and peak detector 250 at this time so that this 2000 volt jump in the value of $V_A$ will not be stored by the peak detector.

At time $T_2$ the microcontroller sends a control signal over wire 145 which directs a pneumatic lift mechanism 146 to move downward, which lowers the lift pins 142 so as to lower the wafer 101 onto the chuck 110. In the preferred embodiment the descent of the wafer takes three seconds. One second after the descent begins, the controller 200 enables the amplifier 220 by setting an enable signal on control line 204. One additional second later, the controller enables the peak detector 250 by setting an enable signal on control line 206. (The peak detector is enabled as late as possible before time $T_3$ to minimize the risk of its being fooled by a noise spike.) About one more second thereafter, at time $T_3$, the wafer drops onto the upper dielectric 114 of the chuck.

When the wafer drops onto the chuck at time $T_3$, a pulse of current flows from the chucking voltage supply 120 to the chuck electrode 113 to charge up the capacitance between the chuck electrode and the grounded wafer 101. The wafer is grounded through its contact with the metal lift pins 142, which are connected to ground through ten megohm resistor 136. This current pulse causes a voltage drop across the first 1-megohm resistor 210, so that the voltage $V_A$ at junction A has a negative-going spike of magnitude $V_3$ superimposed on its +2000 volt DC value. This spike, which is about 56 volts in the preferred embodiment, is amplified by the AC-coupled amplifier 220 and stored by the peak detector 250. It is desirable for the amplifier to be AC-coupled so as to ignore the 2000 volt DC signal and amplify only the pulse.

About one second after time $T_3$, the controller reads and stores in its digital memory the output value $V_p$ appearing on signal line 208 from the peak detector. The stored peak value $V_p$ is a scaled representation of $V_3$; specifically, $V_p$ equals $V_3$ divided by the ratio of the voltage divider resistors 214 and 216, and then multiplied by the gain of amplifier 220. ($V_p=V_3/20$ in the preferred embodiment.) Immediately after storing the value of $V_p$, the controller disables the amplifier and the peak detector because they will not be needed again until the next wafer is processed.

During the period between times $T_3$ and $T_5$, the controller 200 has time to calculate the value of the optimum dechucking voltage for the current wafer. This value will be needed when the wafer release process begins at time $T_5$. The controller calculates the optimum dechucking voltage using the method described in section 3 of this patent specification. Specifically, the controller multiplies the stored pulse measurement $V_p$ by the programmed calibration factor R. (The value of R previously should have been established using the 7-step calibration procedure described in Section 4, above.) The controller then subtracts the product of the multiplication from the value of the "test" chucking voltage. The result is the optimum dechucking voltage.

The calibration factor R preferably is stored as a number in the controller's digital memory, and the controller preferably performs the multiplication using digital arithmetic. The controller readily could be programmed to allow field service personnel to repeat the dechucking calibration procedure (per Section 4, above) and update the value of R stored in the memory.

Referring to FIG. 3, at time $T_4$ the controller 200 sends a control signal over wire 203 which turns on the RF power supply 130. Subsequently, one or more conventional semiconductor device fabrication process steps are pertained on the wafer 101 by the process chamber 100.

At time $T_5$ the fabrication process is completed and the wafer must be released from the chuck. At this time the controller 200 sends a control signal over wire 202 which commands the chucking power supply 120 to reduce its output voltage to the optimum dechucking voltage for this wafer. This dechucking voltage is the value calculated by the controller during the period between times $T_3$ and $T_5$ as explained above.

Because the dechucking voltage must be applied between the chuck electrode 113 and the wafer 101, the RF power is left on during dechucking to maintain a plasma which electrically connects the wafer to the grounded chamber wall 105. However, the RF power level during dechucking preferably is less than the RF power level used for processing the wafer so as to reduce the heating of the water by the plasma. The reduced heating permits turning off, during dechucking, the helium gas which conventionally is introduced between the wafer and the upper face of the chuck to enhance cooling of the wafer during plasma processing. Because the helium gas pressure conventionally is slightly greater (by 1 to 10 torr) than the chamber pressure, leaving the gas pressure on during dechucking could cause the wafer to pop off the chuck into an unpredictable position. Conventional systems using helium gas for wafer cooling are described in U.S. Pat. Nos. 4,680,061; 4,842,683 (column 12, line 54 et seq.); and 4,565,601. The contents of these patents are hereby incorporated into this patent specification. In the plasma etching system in which we implemented the preferred embodiment, the RF frequency is 13.6 MHz, the RF power is 800 to 1000 watts during the etching of the wafer 101 (between times $T_4$ and $T_5$), and the RF power is 25 watts during dechucking (between times $T_5$ and $T_6$).

One or two seconds later, the wafer can be assumed to have discharged its charge to ground in response to the applied dechucking voltage. Therefore, at time $T_6$ the controller sends a control signal over wire 203 which turns off the RF power supply 130 and sends a control signal over wire 145 which commands the pneumatic lift 146 to raise the lift pins 144 so as to remove the wafer from the chuck. Turning off the plasma before the lift pins approach the wafer is desirable to avoid arcing between the plasma and the grounded lift pins.

A few seconds after the pneumatic lift mechanism 146 begins raising the lift pins (at time $T_6$), the pins 144 strike the bottom of the wafer (at time $T_7$) and begin to lift the wafer above the chuck. As soon as the wafer separates from the chuck, the dechucking voltage is no longer needed, so the controller 200 commands the DC voltage supply to reduce its output voltage to zero one or two seconds later (at time $T_8$).

The wafer then is removed from the process chamber 100 by a robot (not shown), a new wafer is carried into the chamber, and the entire described sequence is repeated for the new wafer.

7. Alternative Implementations

As stated above, the circuit shown in FIG. 2 includes a positive peak detector 254 and its associated reset switch 256 which are not used in the preferred dechucking method because the voltage pulse $V_3$ measured at time $T_3$ is always negative. In the preferred dechucking method, the "test" chucking voltage applied from time $T_1$ to time $T_3$ is the same as the actual chucking voltage used during wafer processing between times $T_4$ and $T_5$. Consequently, the dechucking voltage generally is less than the "test" voltage, so that the voltage pulse $V_3$ is negative. Therefore, the positive peak detector 254 and its reset switch 256 could be eliminated. It is possible, although not preferable, to use a "test" voltage during the interval $T_1$ to $T_3$ which is less than the dechucking voltage, in which case the voltage pulse $V_3$ will be positive. To permit this possibility, the circuit shown in FIG. 2 includes a second peak detector 254 which stores positive polarity voltage peaks. Shortly after time $T_3$, the digital controller 200 compares the magnitudes of the outputs of the negative and positive peak detectors 250 and 254. The controller is programmed to ignore the lower magnitude output as likely representing just noise. The controller is programmed to accept the larger magnitude peak output as the true value of the voltage pulse $V_3$, and the controller algebraically adds this value (with a negative or positive sign according to whether the negative or positive peak detector output was selected) to the value of the "test" chucking voltage to calculate the optimum dechucking voltage.

As stated in Section 5 ("Pulse Measurement Techniques"), the voltage pulse $V_3$ could be measured using a conventional integrator circuit rather than a peak detector. Integrators typically are bipolar, so a single integrator could replace both the negative and positive peak detectors 250 and 254. A reset switch such as transistor switch 252 preferably should reset the integrator output to zero just before time $T_3$ so that the integrator output will reflect only the integrated value of the voltage when the wafer drops onto the chuck.

In the preferred embodiment described above, the calibration factor R is stored in the digital memory of the controller 200. The controller includes a conventional arithmetic processor which is programmed to digitally multiply the factor R by the measured peak voltage $V_p$, and then subtract the product from the "test" chucking voltage to determine the optimum dechucking voltage.

Alternatively, it would be possible to perform the arithmetic required by the present invention in analog electronics rather than in the digital controller. Specifically, the multiplication of the pulse value by the calibration factor R could be implemented in the analog measurement circuit shown in FIG. 2. For example, the original resistance of the smaller voltage divider resistor 216 could be multiplied by the previously calculated value of R, or else the original gain of amplifier 220 could be increased by a factor of R, thereby increasing the ratio of $V_p$ to $V_3$ by the same factor R. Implementing the calibration factor R in the analog circuit in this way eliminates the need for the digital controller to store the value of R or to perform any digital multiplication.

For example, suppose the measurement circuit shown in FIG. 2 were used to perform the 7-step method described in Section 4 for calibrating the constant "R". The output voltage $V_p$ of the peak detector 250 would be used to implement the current pulse measurements $I_1$ and $I_2$ in Steps 4 and 6, respectively, of the method. Suppose the value of "R" calculated in Step 7 was then 56. This calibration factor R=56 could be implemented in the analog electronics by: (1) increasing the smaller voltage divider resistor 216 from 10 kilohms to 560 kilohms, or (2) increasing the gain of amplifier 220 from 50 to 2800, or (3) increasing resistor 216 from 10K to 280K and increasing the amplifier gain from 50 to 100.

Although the present invention has been described within the field of semiconductor wafer fabrication, our invention should be equally useful to the operation of any electrostatic chuck in which the chucking voltage is high enough for charges to be trapped in a dielectric layer of the chuck.

We claim:

1. A method of retaining and then releasing a workpiece on an electrostatic chuck, wherein the chuck includes an electrode and a dielectric between the electrode and the workpiece, said method comprising the steps of:

holding the workpiece away from the chuck;

connecting a DC voltage source between the electrode and the workpiece, the voltage source being adjusted to supply an output voltage having a first value;

moving the workpiece to contact the chuck;

measuring the surge of current flow from the voltage source when the workpiece contacts the chuck;

determining an optimum dechucking voltage value by subtracting from the first voltage value an amount proportional to the measured value of the current surge;

adjusting the output voltage to a second value large enough to retain the workpiece on the chuck;

subsequently releasing the workpiece from the chuck by adjusting the output voltage to the value determined to be the optimum dechucking voltage.

2. The method of claim 1 wherein, in the determining step, the amount proportional to the current is obtained by multiplying the measured value of the current surge by a predetermined proportionality constant, and wherein the proportionality constant is predetermined by the steps of:

connecting the voltage source between the electrode and a trial workpiece positioned away from the chuck and adjusting the output voltage of the voltage source to a first trial voltage $V_1$;

moving the trial workpiece to contact the chuck and concurrently performing a first measurement $I_1$ of the surge of current flow from the voltage source;

moving the trial workpiece away from the chuck and adjusting the output voltage to a second trial value $V_2$;

moving the trial workpiece to contact the chuck and concurrently performing a second measurement $I_2$ of the surge of current flow from the voltage source; and setting the proportionality constant to $(V_1-V_2)/(I_1-I_2)$.

3. A method of retaining and then releasing a workpiece on an electrostatic chuck, wherein the chuck includes an electrode and a dielectric between the electrode and the workpiece, said method comprising the steps of:

supplying a DC voltage between first and second terminals, the voltage having a first value;

electrically connecting the first voltage supply terminal to the electrode;

placing the workpiece on the chuck;

electrically connecting the second voltage supply terminal to the workpiece and concurrently measuring the surge of current flow from the voltage supply;

determining an optimum dechucking voltage value by subtracting from the first voltage value an amount proportional to the measured value of the current surge;

connecting a voltage having a second value between the electrode and the workpiece the second value being large enough to retain the workpiece on the chuck;

subsequently releasing the workpiece from the chuck by changing the voltage between the electrode and the workpiece to the value determined to be the optimum dechucking voltage.

4. The method of claim 3 wherein, in the determining step, the amount proportional to the current is obtained by multiplying the measured value of the current surge by a predetermined proportionality constant, and wherein the proportionality constant is predetermined by the steps of:

placing a trial workpiece on the chuck;

connecting the voltage source between the electrode and the trial workpiece, adjusting the output of the voltage source to a first trial voltage $V_1$, and performing a first measurement $I_1$ of the surge of current flow from the voltage source;

connecting the voltage source between the electrode and the trial workpiece, adjusting the output of the voltage source to a second trial voltage $V_2$, and performing a second measurement $I_2$ of the surge of current flow from the voltage source; and setting the proportionality constant to $(V_1-V_2)/(I_1-I_2)$.

5. A method of releasing a workpiece from an electrostatic chuck, wherein the chuck includes an electrode and a dielectric between the electrode and the workpiece, said method comprising the steps of:

while the workpiece is positioned on the dielectric, applying to the electrode a voltage of a polarity opposite the polarity of any electrostatic charge held in the dielectric and of a magnitude which induces in the electrode an electrostatic charge which balances the charge held in the dielectric, whereby any electrostatic attractive force between the workpiece and the chuck is minimized; and physically removing the workpiece from the chuck.

6. A method of retaining and then releasing a workpiece on an electrostatic chuck, wherein the chuck includes an electrode and a dielectric between the electrode and the workpiece, said method comprising the steps of:

applying to the electrode a first voltage large enough to retain the workpiece on the chuck by electrostatic attractive force; and subsequently decreasing the voltage to a reduced value of the same polarity, said reduced value being selected so as to minimize the electrostatic attractive force retaining the workpiece, and said reduced value being substantially greater than zero.

7. The method of claim 6, wherein the step of subsequently decreasing the voltage comprises the steps of:

(a) decreasing the voltage;

(b) testing the force required to move the workpiece; and (c) sequentially repeating steps (a) and (b) until the force required to move the workpiece in the testing step falls below a threshold.

8. The method of claim 7, wherein the step of testing the force comprises testing whether the workpiece slides along a surface of the chuck when a predetermined force is applied to the wafer in a direction parallel to the surface of the chuck.

9. The method of claim 7, wherein the step of testing the force comprises testing whether the workpiece can be separated from the chuck when a predetermined force is applied to the wafer in a direction away from the chuck.

10. A method of retaining and then releasing a production workpiece on an electrostatic chuck, wherein the chuck includes an electrode and a dielectric between the electrode and the workpiece, said method comprising the steps of:

(a) placing a test workpiece on the chuck;

(b) determining an optimum dechucking voltage value by (i) testing the electrostatic force retaining the workpiece on the chuck for each of a plurality of different voltages, and (ii) selecting as the optimum dechucking voltage value the one of the different voltages which produced the smallest electrostatic force in the testing step;

(c) removing the test workpiece from the chuck;

(d) placing a production workpiece on the chuck;

(e) applying to the electrode a voltage large enough to retain the production workpiece on the chuck by electrostatic attractive force;

(f) subsequently releasing the production workpiece by changing the voltage applied to the electrode to the optimum dechucking voltage value.

11. A method of releasing a workpiece from an electrostatic chuck, wherein the chuck includes an electrode and a dielectric between the electrode and the workpiece, said method comprising the steps of:

while the workpiece is positioned on the dielectric, applying to the electrode a voltage of a polarity that is the same as the polarity of any voltage previously applied to retain the workpiece electrostatically on the chuck and of a magnitude which induces in the electrode an electrostatic charge which tends to balance any charge previously held in the dielectric, whereby any electrostatic attractive force between the workpiece and the chuck is minimized; and physically removing the workpiece from the chuck.

* * * * *